(12) United States Patent
Chatterjee et al.

(10) Patent No.: US 10,228,422 B2
(45) Date of Patent: *Mar. 12, 2019

(54) DRIVING PERVASIVE COMMANDS USING BREAKPOINTS IN A HARDWARE-ACCELERATED SIMULATION ENVIRONMENT

(71) Applicant: International Business Machines Corporation, Armonk, NY (US)

(72) Inventors: Debapriya Chatterjee, Austin, TX (US); Shakti Kapoor, Austin, TX (US); John A. Schumann, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/594,910

(22) Filed: May 15, 2017

(65) Prior Publication Data

US 2018/0120379 A1    May 3, 2018

Related U.S. Application Data

(63) Continuation of application No. 15/339,314, filed on Oct. 31, 2016, now Pat. No. 9,747,396.

(51) Int. Cl.
*G06F 17/50* (2006.01)
*G01R 31/3185* (2006.01)
(Continued)

(52) U.S. Cl.
CPC .... *G01R 31/318533* (2013.01); *G06F 11/261* (2013.01); *G06F 11/3457* (2013.01);
(Continued)

(58) Field of Classification Search
CPC .. G06F 17/504; G06F 17/5054; G06F 11/261; G06F 11/3457; G06F 17/5022; G06F 17/5027; G01R 31/318533
See application file for complete search history.

(56) References Cited

U.S. PATENT DOCUMENTS

| 2002/0049578 A1* | 4/2002 | Ohkami | G06F 17/5022 703/15 |
|---|---|---|---|
| 2005/0081170 A1* | 4/2005 | Hyduke | G06F 17/5027 716/114 |

(Continued)

OTHER PUBLICATIONS

List of IBM Patents or Patent Applications Treated as Related, Jun. 16, 2017, 2 pages.

(Continued)

*Primary Examiner* — Vuthe Siek
(74) *Attorney, Agent, or Firm* — Cantor Colburn LLP; Bryan Bortnick

(57) ABSTRACT

An aspect includes driving a plurality of commands to an interface unit of a circuit design in a hardware-accelerated simulator to dynamically initialize the circuit design to run one or more test cases based on an initialization sequence with breakpoint support. A state of the circuit design is examined through the interface unit based on triggering of a breakpoint on the hardware-accelerated simulator. A next action to perform in the initialization sequence is determined based on the state of the circuit design as determined through the interface unit. Execution of one or more scripts select the initialization sequence from a plurality of test cases, set the breakpoint, modify a state of the circuit design as the next action to perform, and capture a plurality of test results based on execution of the initialization sequence through the interface unit.

18 Claims, 5 Drawing Sheets

(51) Int. Cl.
*G06F 11/26* (2006.01)
*G06F 11/34* (2006.01)

(52) U.S. Cl.
CPC ........ *G06F 17/504* (2013.01); *G06F 17/5022* (2013.01); *G06F 17/5027* (2013.01)

(56) References Cited

U.S. PATENT DOCUMENTS

2011/0307847 A1* 12/2011 Liao .................... G06F 17/5027 716/103
2012/0317533 A1* 12/2012 Zawalski ............ G06F 17/5027 716/136

OTHER PUBLICATIONS

U.S. Appl. No. 15/339,314, filed Oct. 31, 2016 Entitled: Driving Pervasive Commands Using Breakpoints in a Hardware-Accelerated Simulation Environment, First Named Inventor: Debapriya Chatterjee.

* cited by examiner

DRIVING PERVASIVE COMMANDS USING BREAKPOINTS IN A HARDWARE-ACCELERATED SIMULATION ENVIRONMENT

DOMESTIC PRIORITY

This application is a continuation of U.S. patent application Ser. No. 15/339,314 filed Oct. 31, 2016, the content of which is incorporated by reference herein in its entirety.

BACKGROUND

Aspects are related generally to processing systems, and more specifically to driving pervasive commands using breakpoints in a hardware-accelerated simulation environment.

During the development cycle of a circuit, the functionality of the circuit may be analyzed using functional verification. Functional verification may be performed using a simulator, such as a Hardware Descriptive Language (HDL) simulator, which provides a software simulation of the behavior of the circuit. Additionally or alternatively, an acceleration platform, also referred to as an "accelerator" or a "hardware accelerator", may be utilized to perform functional verification. As the accelerator is implemented in hardware, it is much faster than a software-based simulator. However, there is a reduced visibility to the value of each signal in the circuit design during the simulated execution by the accelerator with respect to a software-based simulator.

One use of the acceleration platform is to run post-silicon testing applications that once loaded to the system, continuously generate test cases, execute the test cases, and check the results. Initialization to support testing must be done at the proper time and when the design is in the proper state. Detecting when and how to do the initialization to efficiently execute a test sequence on the accelerator is a difficult challenge. For instance, the initialization may have to be done on incomplete designs that are unable to fully execute instructions.

SUMMARY

According to one embodiment, a method includes driving a plurality of commands to an interface unit of a circuit design in a hardware-accelerated simulator to dynamically initialize the circuit design to run one or more test cases based on an initialization sequence with breakpoint support. A state of the circuit design is examined through the interface unit based on triggering of a breakpoint on the hardware-accelerated simulator. A next action to perform in the initialization sequence is determined based on the state of the circuit design as determined through the interface unit. Execution of one or more scripts select the initialization sequence from a plurality of test cases, set the breakpoint, modify a state of the circuit design as the next action to perform, and capture a plurality of test results based on execution of the initialization sequence through the interface unit.

According to another embodiment, a system includes a hardware-accelerated simulator, a processor in communication with the hardware-accelerated simulator, and a memory. The memory stores program code, which when executed on the processor, performs an operation of circuit design verification that includes driving a plurality of commands to an interface unit of a circuit design in the hardware-accelerated simulator to dynamically initialize the circuit design to run one or more test cases based on an initialization sequence with breakpoint support. The operation also includes examining a state of the circuit design through the interface unit based on triggering of a breakpoint on the hardware-accelerated simulator and determining a next action to perform in the initialization sequence based on the state of the circuit design as determined through the interface unit. Execution of one or more scripts select the initialization sequence from a plurality of test cases, set the breakpoint, modify a state of the circuit design as the next action to perform, and capture a plurality of test results based on execution of the initialization sequence through the interface unit.

According to another embodiment, a computer program product includes a computer readable storage medium having program instructions embodied therewith. The program instructions are executable by a processor to cause the processor to drive a plurality of commands to an interface unit of a circuit design in a hardware-accelerated simulator to dynamically initialize the circuit design to run one or more test cases based on an initialization sequence with breakpoint support. The program instructions are further executable by the processor to cause the processor to examine a state of the circuit design through the interface unit based on triggering of a breakpoint on the hardware-accelerated simulator and determine a next action to perform in the initialization sequence based on the state of the circuit design as determined through the interface unit. Execution of one or more scripts select the initialization sequence from a plurality of test cases, set the breakpoint, modify a state of the circuit design as the next action to perform, and capture a plurality of test results based on execution of the initialization sequence through the interface unit.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter is particularly pointed out and distinctly claimed in the claims at the conclusion of the specification. The forgoing and other features, and advantages of the embodiments herein are apparent from the following detailed description taken in conjunction with the accompanying drawings in which:

DETAILED DESCRIPTION

Embodiments drive dynamic initialization precisely by using breakpoints in a hardware-accelerated simulation environment. By leveraging an alter display unit (ADU) within a circuit design, a breakpoint methodology can be used to efficiently and precisely execute dynamic initialization sequences via the ADU. The ADU is a type of interface unit that may be associated with one or more components or devices of a pervasive architecture in a circuit design that can inspect and modify states of processing system elements, such as registers, logic units, memory, and the like, including modifying intermediate states that are not otherwise directly configurable by code execution. The ADU allows for an initialization sequence to be created before all of the logic is functional within a circuit design. Items in the initialization sequence are driven by commands into the ADU. One or more breakpoints can be established to dynamically drive and adjust initialization sequences to achieve desired test coverage in the hardware-accelerated simulation environment.

Figure 1:
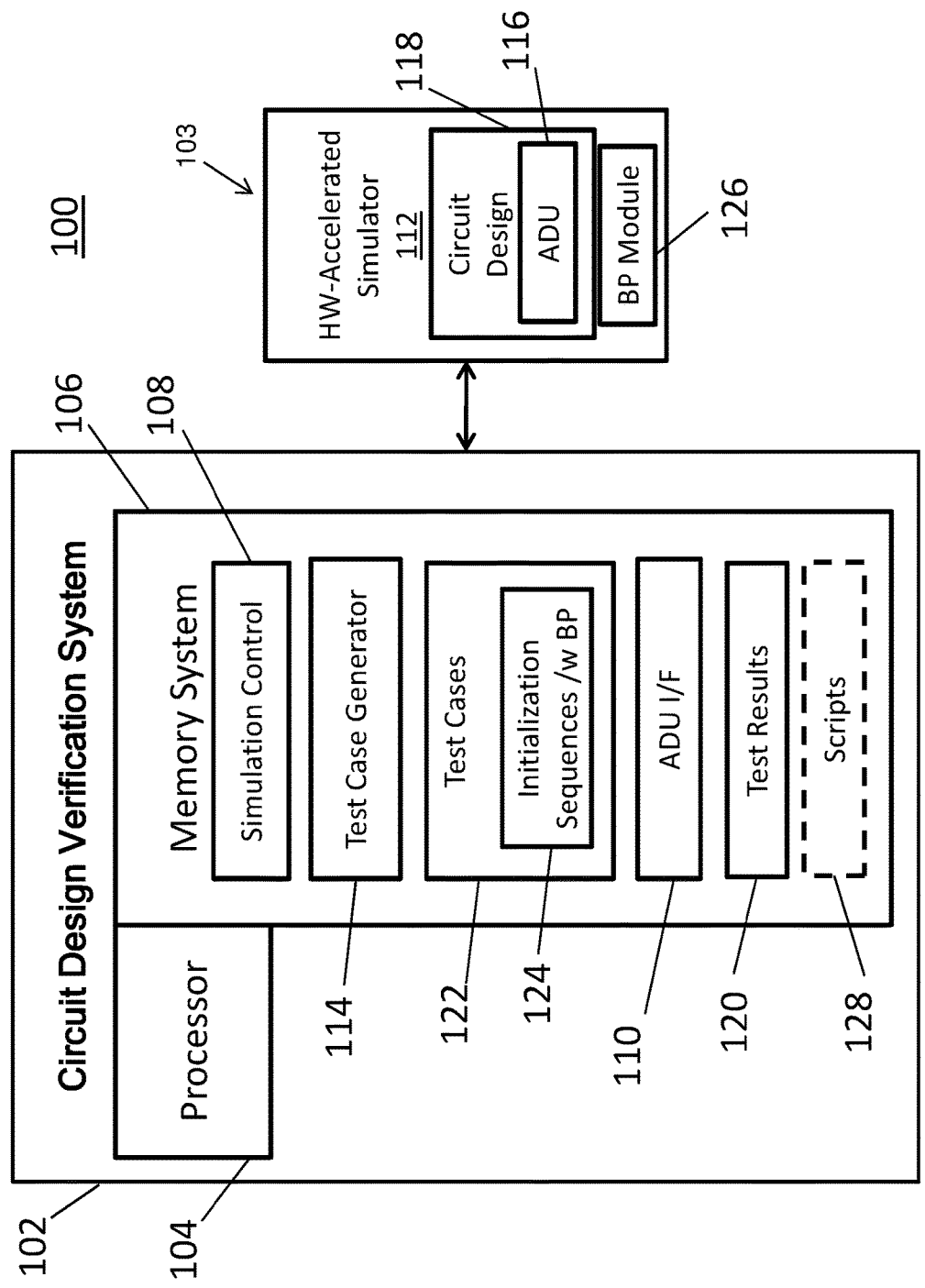
FIG. 1 illustrates a system in accordance with an embodiment.

Turning now to FIG. 1, a system 100 is generally shown that includes a circuit design verification system 102 and a hardware-accelerated simulator 112 in a hardware-accelerated simulation environment 103. The circuit design verification system 102 includes a processor 104 and a memory system 106. The processor 104 can be any type of processing circuit, including multiple instances thereof, that is configurable to execute processes further described herein, where the memory system 106 is an example of a tangible storage medium. The memory system 106 can include various applications and files. For example, a test case generator 114 can generate test cases 122 as test bench code to test a circuit design 118 in the hardware-accelerated simulator 112. A simulation control 108 of the circuit design verification system 102 can run one or more initialization sequences 124 with breakpoint support to ensure that the circuit design verification system 102 is properly configured to a desired state. The simulation control 108 can execute the initialization sequences 124 and test cases 122 to produce test results 120 that may include pass/fail criteria, performance parameters, and/or other test metrics. The initialization sequences 124 can be defined initially by the test case generator 114 and modified as characteristics of the circuit design 118 are better understood, for instance, as a result of observing the test results 120 produced by executing the test cases 122 with particular configuration parameters and/or sequencing in the initialization sequences 124.

The simulation control 108 can drive a plurality of commands to an ADU 116 as an interface unit of the circuit design 118 in the hardware-accelerated simulator 112 to dynamically initialize the circuit design 118 to run one or more test cases 122 based on one or more of the initialization sequences 124 with breakpoint support. An ADU interface 110 of the circuit design verification system 102, such as a port or application programming interface (API) of the circuit design verification system 102, can enable the simulation control 108 to send pervasive commands to the ADU 116 and inspect and/or modify a plurality of states of a plurality of processing system elements in the circuit design 118.

The hardware-accelerated simulator 112 is configured to simulate execution of circuit design 118 using, for example, test bench code. The hardware-accelerated simulator 112 is a special-purpose machine that can be programmed by loading its memory with an instruction stream produced prior to simulation by a compiler that schedules each logical primitive at a specific time on a specific processor. In some embodiments, the hardware-accelerated simulator 112 may be comprised of one or more Application-Specific Integrated Circuit (ASIC), Field Programmable Gate Array (FPGA), or the like. Compared to software-only-based simulators, hardware-accelerated simulator 112 provides a level of simulation performance necessary to perform end-to-end system level checking for modern system-on-chip designs with a reasonable turnaround period for a simulate-debug-fix-rebuild-rerun cycle.

A breakpoint controller of the simulation control 108 can bridge the gap between a system level (or lower level) of the hardware-accelerated simulator 112 and an application level (or higher level) test bench code. This allows the hardware-accelerated simulator 112 to achieve close to maximum performance because, unlike software simulators where test bench code is evaluated after each simulation cycle, embodiments can execute test bench code at sparse intervals (triggered by the breakpoints) of system level checks or monitors. In one embodiment, a breakpoint controller can be implemented by a library layer used by the test bench code as part of the simulation control 108.

Although the hardware-accelerated simulator 112 provides an increased level of simulation performance, executing typical unit-level software test bench code on the hardware-accelerated simulation environment 103 can lead to inefficiencies in utilizing the full extent of the simulation performance offered by the hardware-accelerated simulator 112. Using breakpoints bridges the gap between the lower-level hardware-accelerated simulator 112 and the higher-level test bench code defined in test cases 122 and/or initialization sequences 124.

In the example of FIG. 1, the hardware-accelerated simulator 112 includes a breakpoint module 126 and the circuit design 118 with the ADU 116. The circuit design 118 is a functional definition of an electronic circuit, e.g., a target processor, chip, integrated circuit (IC) or other hardware product. The circuit design 118 may be provided in a computer-readable form using any hardware description language (HDL) including but not limited to VHDL, Verilog, SystemC, EDL, RTL, PSL or the like. The circuit design 118 can be loaded into the hardware-accelerated simulator 112 to simulate operation of a physical embodiment of the circuit design 118.

The breakpoint module 126 can be configured to provide simulator-level breakpoint functionality, which may be triggered by a value change in an observed design signal of the circuit design 118. In one or more embodiments, the breakpoint module 126 communicates with the simulation control 108 when a breakpoint within the hardware-accelerated simulator 112 occurs. When a breakpoint occurs, the breakpoint module 126 can pause the hardware-accelerated simulator 112 so that control can be transferred from the system-level hardware-accelerated simulator 112 to the application-level execution of test bench code of the initialization sequences 124 and/or test cases 122 for handling. One type of simulator breakpoint is a timed breakpoint, which occurs in the hardware-accelerated simulator 112 when a preset number of simulation cycles have elapsed. Facility breakpoints can occur when a design signal of the circuit design 118 changes value. In some embodiments, access to the breakpoint module 126 may be provided by a lower-level breakpoint application program interface (API). Whenever a simulator breakpoint or a breakpoint from a lower-level breakpoint API occurs, the hardware-accelerated simulator 112 can pause and return control to the software test bench code being executed on the circuit design verification system 102 attached to the hardware-accelerated simulator 112.

The hardware-accelerated simulator 112 can generate simulation-layer breakpoints associated with the breakpoints in the initialization sequences 124 and/or test cases 122. For example, the hardware-accelerated simulator 112 may generate a timed breakpoint based on execution of an expected number of cycles or a facility breakpoint based on an internal signal state of the circuit design 118.

The hardware-accelerated simulator 112 begins simulation of the circuit design 118, and initialization sequences 124 can be used to change the state of the circuit design 118 through the ADU 116. Simulating the circuit design 118 allows for the functionality of the circuit design 118 to be analyzed using functional verification. During simulation, the hardware-accelerated simulator 112 can check if breakpoints are triggered and pauses the simulation responsive to breakpoint triggering. The hardware-accelerated simulator 112 can determine whether a breakpoint occurs during execution of initialization sequences 124. A breakpoint occurs at the hardware-accelerated simulator level if a breakpoint at a breakpoint controller layer that is associated with a breakpoint at the hardware-accelerated simulator 112 is triggered. If a breakpoint has not occurred, the hardware-accelerated simulator 112 continues to execute the circuit design 118.

If a breakpoint has occurred, then the hardware-accelerated simulator 112 pauses simulation and transfers control to the simulation control 108. When the hardware-accelerated simulator 112 transfers control to the simulation control 108, this allows the simulation control 108 to execute a callback function associated with the breakpoint that caused the pause in simulation. While the simulation is paused, the simulation control 108 can check status and make updates to states within the circuit design 118 through the ADU 116. When any updates are made as part of the initialization sequences 124 while the circuit design 118 is paused, the simulation control 108 can set one or more subsequent breakpoints and return from the breakpoint to continue operation by the circuit design 118 until at least one of the initialization sequences 124 and associated test cases 122 are completed. In some embodiments, scripts 128 can capture and automate the sequence of interactions of processing breakpoints, including, for instance, selecting one of the initialization sequences 124 from a plurality of test cases 122, setting the breakpoint, modifying a state of the circuit design 118 as the next action to perform, and capturing a plurality of test results 120 based on execution of the initialization sequence 124 through ADU 116.

Figure 2:
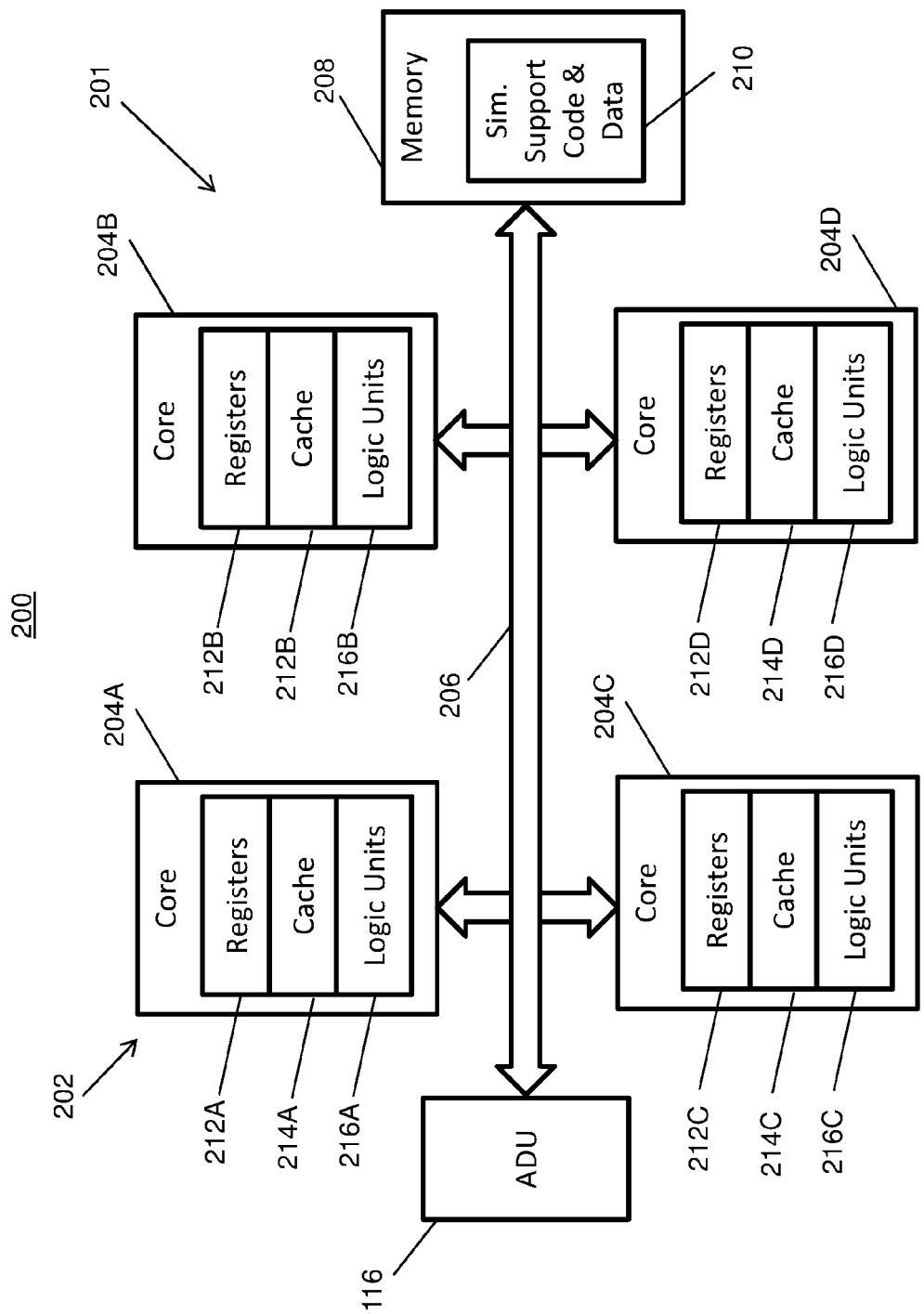
FIG. 2 illustrates a circuit design in accordance with an embodiment.

FIG. 2 illustrates a circuit design 200 in accordance with an embodiment as an example of elements that can be included within the circuit design 118 of FIG. 1. The circuit design 200 includes a plurality of processing system elements 201, such as a processor 202 that includes a plurality of cores 204A, 204B, 204C, and 204D. A pervasive infrastructure 206 (e.g., one or more buses, ports, and timing logic) establishes communication between the ADU 116 and the cores 204A-204D. The pervasive infrastructure 206 may also provide access to memory 208 of the circuit design 200 in which simulation support code and data 210 can reside. The simulation support code and data 210 may include a workload and/or data associated with test cases 122 of FIG. 1. The simulation support code and data 210 may be accessible by one or more of the cores 204A-204D in the hardware-accelerated simulator 112 of FIG. 1. Each of the cores 204A-204D can include, for instance, corresponding registers 212A, 212B, 212C, 212D, memory such as cache 214A, 214B, 214C, 214D, logic units 216A, 216B, 216C, 216D, and other processing system elements known in the art. The logic units 216A-216D can include instruction processing pipelines, cache controls, memory controls, input/output interfaces, interrupt/exception handlers, and the like.

Rather than relying on execution of simulation instructions by the cores 204A-204D, the ADU 116 provides a path to pervasively drive components of the circuit design 200 to a desired state during initialization. For instance, the initialization sequences 124 of FIG. 1 can inspect and modify values in the registers 212A-212B, the cache 214A-214D, the logic units 216A-216D, and/or the memory 208. The ADU 116 does not rely upon the instruction execution capability of the logic units 216A-216D, and thus the circuit design 200 need not be a fully functional and complete design to run the initialization sequences 124 and test cases 122.

Figure 3:
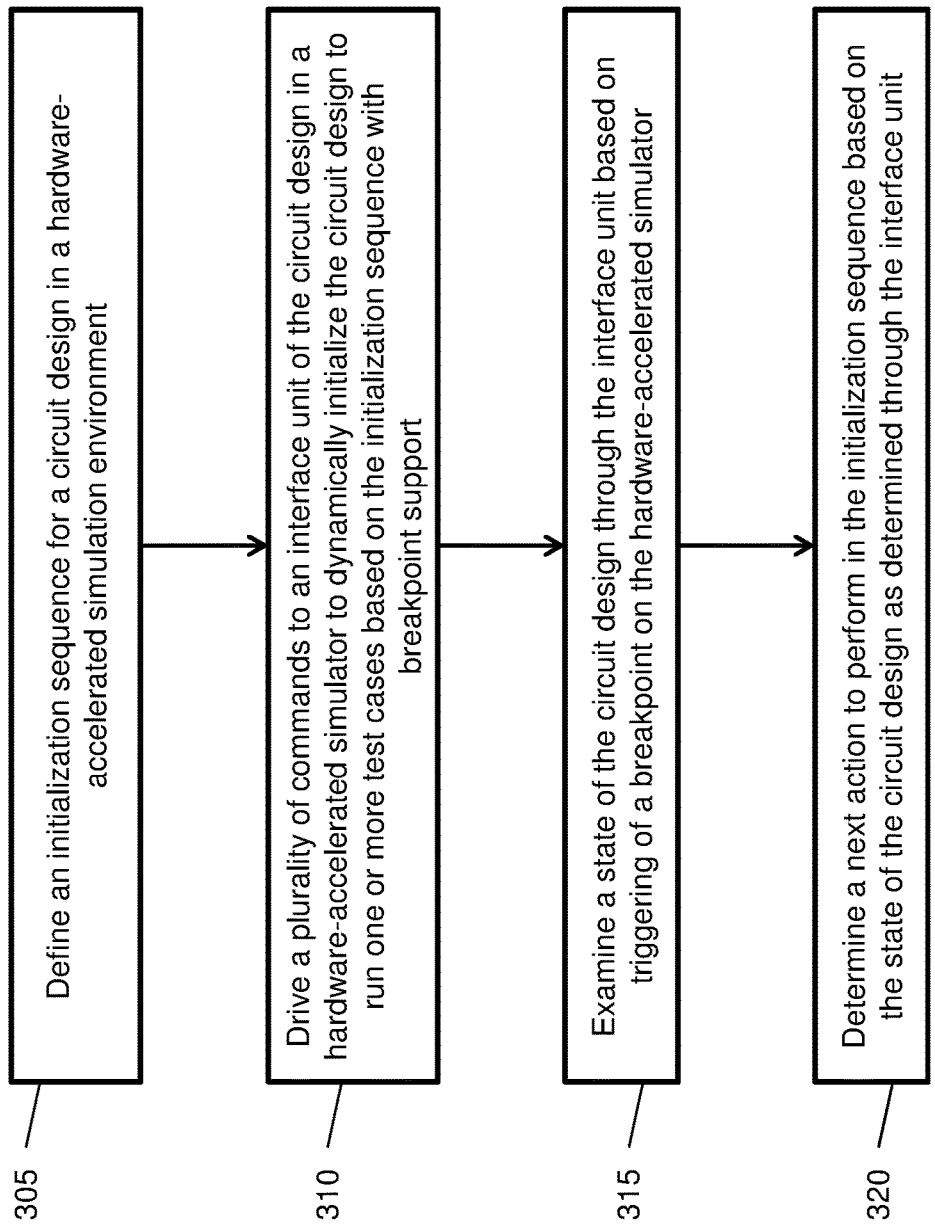
FIG. 3 illustrates a process flow in accordance with an embodiment.

Turning now to FIG. 3, a flow diagram of a process 300 for driving pervasive commands using breakpoints in a hardware-accelerated simulation environment is generally shown in accordance with an embodiment. The process 300 is described with reference to FIGS. 1-2 and may include additional steps beyond those depicted in FIG. 3.

At block 305, an initialization sequence 124 is defined for a circuit design 118, 200 in a hardware-accelerated simulation environment 103. Defining the initialization sequence 124 can be performed as an offline process by domain experts or as part of an automated process. Depending on the results of the process 300, the initialization sequence 124 can be adjusted until a desired state is reached by the circuit design 118, 200. At block 310, a plurality of commands is driven to an interface unit (e.g., the ADU 116) of the circuit design 118, 200 in a hardware-accelerated simulator 112 to dynamically initialize the circuit design 118 to run one or more test cases 122 based on the initialization sequence 124 with breakpoint support.

At block 315, a state of the circuit design 118, 200 is examined through the ADU 116 based on triggering of a breakpoint on the hardware-accelerated simulator 112. The breakpoint can be set to trigger based on execution of an expected number of cycles by the circuit design 118, 200 in the hardware-accelerated simulator 112. Alternatively, the breakpoint can be set to trigger based on an internal signal state of the circuit design 118, 200 in the hardware-accelerated simulator 112.

At block 320, a next action to perform in the initialization sequence 124 is determined based on the state of the circuit design 118, 200 as determined through the ADU 116. The ADU 116 can be used to inspect and modify a plurality of states of a plurality of processing system elements 201 in the circuit design 200. For instance, the ADU 116 can inspect and modify a plurality of registers 212A-212D, logic units 216A-216D, and memory (e.g., cache 214A-214D and/or memory 208) in a plurality of cores 204A-204D of the circuit design 200 through a pervasive infrastructure 206 establishing communication between the ADU 116 and the cores 204A-204D. Execution of the initialization sequence 124 can be paused based on triggering of the breakpoint. One or more subsequent breakpoints can be set based on the state of the circuit design 118, 200 as determined through the ADU 116. Execution of the initialization sequence 124 can then be resumed.

Figure 4:
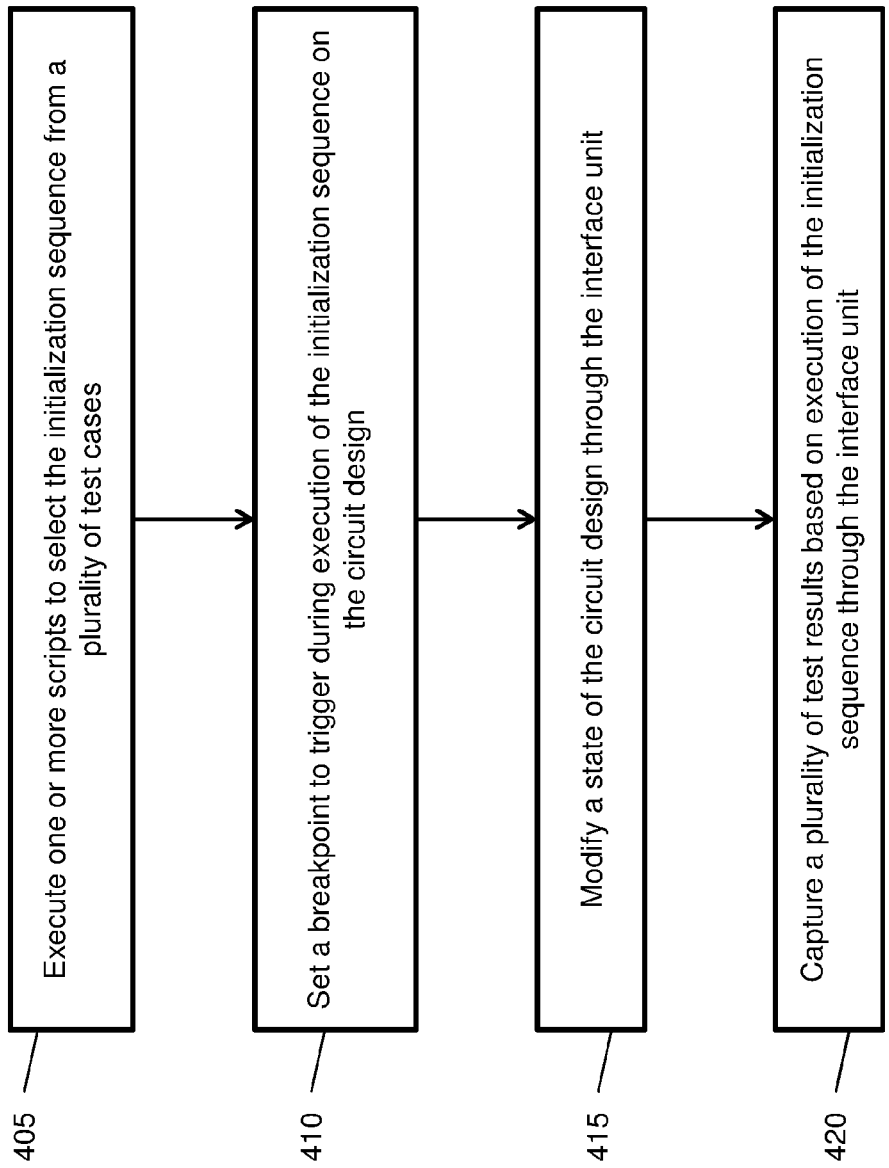
FIG. 4 illustrates another process flow in accordance with an embodiment.

Turning now to FIG. 4, a flow diagram of a process 400 for driving pervasive commands using breakpoints in a hardware-accelerated simulation environment is generally shown in accordance with an embodiment. The process 400 is described with reference to FIGS. 1-3 and may include additional steps beyond those depicted in FIG. 4. The process 400 can be performed in conjunction with the process 300 of the FIG. 3 when the scripts 128 are used.

At block 405, one or more scripts 128 are executed by the circuit design verification system 102 to select the initialization sequence 124 from a plurality of test cases 122. At block 410, a breakpoint is set to trigger during execution of the initialization sequence 124 on the circuit design 118, 200. At block 415, a state of the circuit design 118, 200 is modified through the ADU 116, for instance, as a next action to perform in the process 300 of FIG. 3. At block 420, a plurality of test results 120 is captured based on execution of the initialization sequence 124 through the ADU 116.

Figure 5:
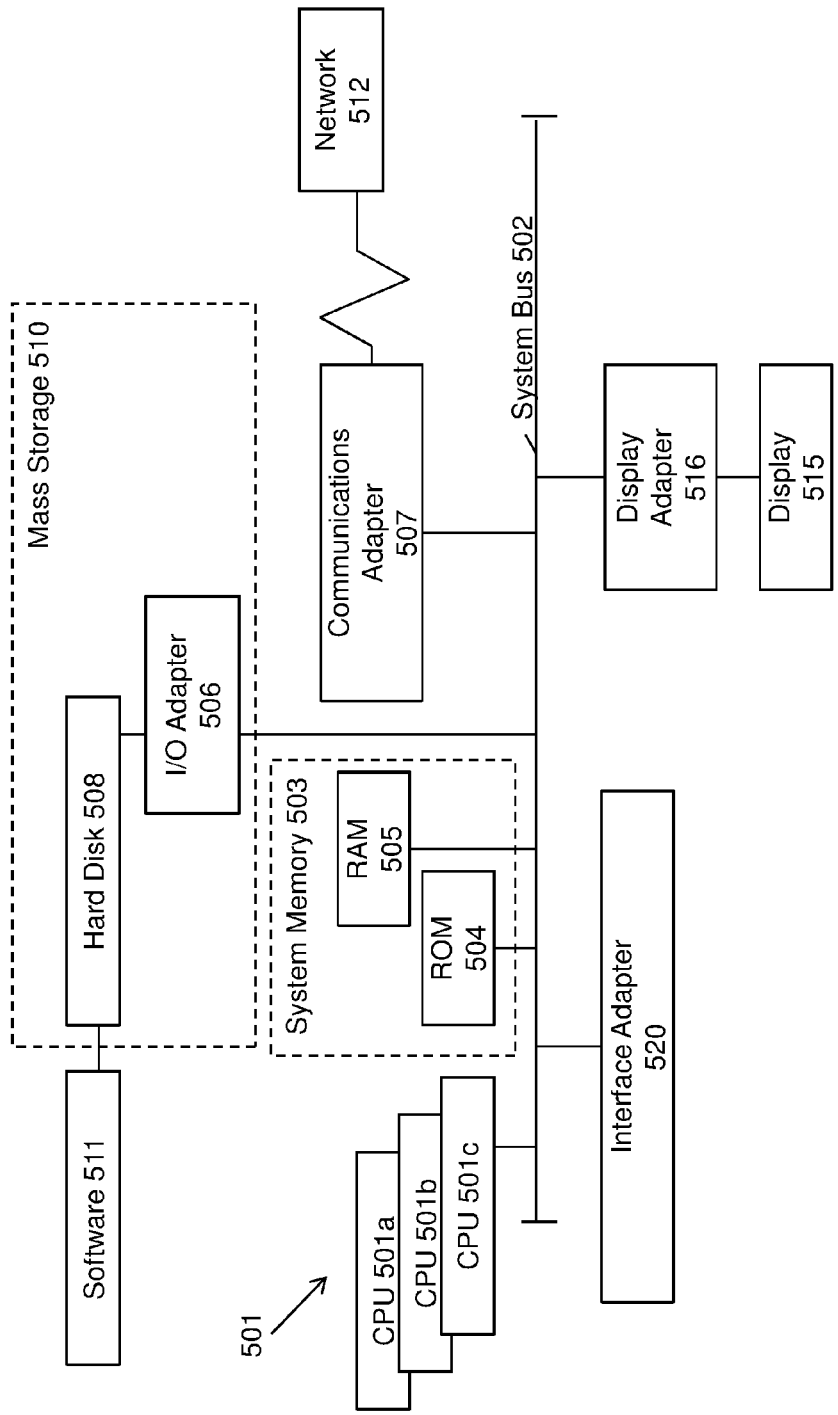
FIG. 5 illustrates a processing system in accordance with an embodiment.

Referring now to FIG. 5, there is shown an embodiment of a processing system 500 for implementing the teachings herein. In this embodiment, the processing system 500 has one or more central processing units (processors) 501a, 501b, 501c, etc. (collectively or generically referred to as processor(s) 501). Alternatively, the processors 501 can be an embodiment of the processor 104 of FIG. 1 or the processor 202 of FIG. 2. The processors 501, also referred to as processing circuits, are coupled via a system bus 502 to a system memory 503 and various other components. The system memory 503 can include read only memory (ROM) 504 and random access memory (RAM) 505. The ROM 504 is coupled to system bus 502 and may include a basic input/output system (BIOS), which controls certain basic functions of the processing system 500. RAM 505 is read-write memory coupled to system bus 502 for use by the processors 501.

FIG. 5 further depicts an input/output (I/O) adapter 506 and a communications adapter 507 coupled to the system bus 502. I/O adapter 506 may be a small computer system interface (SCSI) adapter that communicates with a hard disk 508 and/or any other similar component. I/O adapter 506 and hard disk 508 are collectively referred to herein as mass storage 510. Software 511 for execution on the processing system 500 may be stored in mass storage 510. The mass storage 510 is an example of a tangible storage medium readable by the processors 501, where the software 511 is stored as instructions for execution by the processors 501 to perform a method, such as the processes 300, 400 of FIGS. 3 and 4. Communications adapter 507 interconnects the system bus 502 with an outside network 512 enabling processing system 500 to communicate with other such systems. A display 515 is connected to system bus 502 via a display adapter 516, which may include a graphics controller to improve the performance of graphics intensive applications and a video controller. In one embodiment, adapters 506, 507, and 516 may be connected to one or more I/O buses that are connected to the system bus 502 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices can be connected to the system bus 502 via an interface adapter 520 and the display adapter 516. A keyboard, mouse, speaker can be interconnected to the system bus 502 via the interface adapter 520, which may include, for example, a Super I/O chip integrating multiple device adapters into a single integrated circuit.

Thus, as configured in FIG. 5, the processing system 500 includes processing capability in the form of processors 501, and, storage capability including the system memory 503 and the mass storage 510, input means such as keyboard and mouse, and output capability including speaker and the display 515. In one embodiment, a portion of the system memory 503 and the mass storage 510 collectively store an operating system, such as the z/OS or AIX operating system from IBM Corporation, to coordinate the functions of the various components shown in FIG. 5.

Technical effects and benefits include driving dynamic initialization of a circuit design precisely by using breakpoints in a hardware-accelerated simulation environment. Using an interface unit (e.g., the ADU) within the circuit design allows for an initialization sequence to be done even before all of the logic under test within the circuit design is functional. Embodiments improve the speed of chip verification testing as compared to software-based simulators while also enabling inspection and modification of states within a circuit design in a hardware-accelerated simulator.

Embodiments may include a system and/or a method at any possible technical detail level of integration. The system may include a computer readable storage medium (or media) having computer readable program instructions thereon for causing a processor to carry out aspects of the embodiments herein. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the embodiments herein may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the embodiments herein.

Aspects of the embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   driving a plurality of commands to an interface unit of a circuit design in a hardware-accelerated simulator to dynamically initialize the circuit design to run one or more test cases based on an initialization sequence with breakpoint support;
   examining a state of the circuit design through the interface unit based on triggering of a breakpoint on the hardware-accelerated simulator; and
   determining a next action to perform in the initialization sequence based on the state of the circuit design as determined through the interface unit, wherein a circuit design verification system executes one or more scripts to select the initialization sequence from a plurality of test cases, set the breakpoint, modify a state of the circuit design as the next action to perform, and capture a plurality of test results based on execution of the initialization sequence through the interface unit.

2. The method of claim 1, wherein the interface unit is an alter display unit operable to inspect and modify a plurality of states of a plurality of processing system elements in the circuit design.

3. The method of claim 1, wherein the breakpoint is set to trigger based on execution of an expected number of cycles by the circuit design in the hardware-accelerated simulator.

4. The method of claim 1, wherein the breakpoint is set to trigger based on an internal signal state of the circuit design in the hardware-accelerated simulator.

5. The method of claim 1, further comprising:
   pausing execution of the initialization sequence based on triggering of the breakpoint;
   setting one or more subsequent breakpoints based on the state of the circuit design as determined through the interface unit; and
   resuming execution of the initialization sequence.

6. The method of claim 1, wherein the breakpoint is set to trigger during execution of the initialization sequence on the circuit design.

7. A system comprising:
   a hardware-accelerated simulator;
   a processor in communication with the hardware-accelerated simulator; and a memory, storing program code, which when executed on the processor, performs an operation of circuit design verification, the operation comprising:

driving a plurality of commands to an interface unit of a circuit design in the hardware-accelerated simulator to dynamically initialize the circuit design to run one or more test cases based on an initialization sequence with breakpoint support;

examining a state of the circuit design through the interface unit based on triggering of a breakpoint on the hardware-accelerated simulator; and determining a next action to perform in the initialization sequence based on the state of the circuit design as determined through the interface unit, wherein the operation is executed by one or more scripts to select the initialization sequence from a plurality of test cases, set the breakpoint, modify a state of the circuit design as the next action to perform, and capture a plurality of test results based on execution of the initialization sequence through the interface unit.

8. The system of claim 7, wherein the interface unit is an alter display unit operable to inspect and modify a plurality of states of a plurality of processing system elements in the circuit design.

9. The system of claim 7, wherein the breakpoint is set to trigger based on execution of an expected number of cycles by the circuit design in the hardware-accelerated simulator.

10. The system of claim 7, wherein the breakpoint is set to trigger based on an internal signal state of the circuit design in the hardware-accelerated simulator.

11. The system of claim 7, wherein the operation further comprises:

pausing execution of the initialization sequence based on triggering of the breakpoint;

setting one or more subsequent breakpoints based on the state of the circuit design as determined through the interface unit; and resuming execution of the initialization sequence.

12. The system of claim 7, wherein the breakpoint is set to trigger during execution of the initialization sequence on the circuit design.

13. A computer program product comprising a non-transitory computer readable storage medium having program instructions embodied therewith, the program instructions executable by a processor to cause the processor to perform:

driving a plurality of commands to an interface unit of a circuit design in a hardware-accelerated simulator to dynamically initialize the circuit design to run one or more test cases based on an initialization sequence with breakpoint support;

examining a state of the circuit design through the interface unit based on triggering of a breakpoint on the hardware-accelerated simulator; and determining a next action to perform in the initialization sequence based on the state of the circuit design as determined through the interface unit, wherein one or more scripts to select the initialization sequence from a plurality of test cases, set the breakpoint, modify a state of the circuit design as the next action to perform, and capture a plurality of test results based on execution of the initialization sequence through the interface unit.

14. The computer program product of claim 13, wherein the interface unit is an alter display unit operable to inspect and modify a plurality of states of a plurality of processing system elements in the circuit design.

15. The computer program product of claim 13, wherein the breakpoint is set to trigger based on execution of an expected number of cycles by the circuit design in the hardware-accelerated simulator.

16. The computer program product of claim 13, wherein the breakpoint is set to trigger based on an internal signal state of the circuit design in the hardware-accelerated simulator.

17. The computer program product of claim 13, wherein the program instructions executable by the processor to cause the processor to perform:

pausing execution of the initialization sequence based on triggering of the breakpoint;

setting one or more subsequent breakpoints based on the state of the circuit design as determined through the interface unit; and resuming execution of the initialization sequence.

18. The computer program product of claim 13, wherein the breakpoint is set to trigger during execution of the initialization sequence on the circuit design.

* * * * *